(12) United States Patent
Kim et al.

(10) Patent No.: US 8,050,374 B2
(45) Date of Patent: Nov. 1, 2011

(54) SEMICONDUCTOR MEMORY DEVICE CAPABLE OF CONTROLLING TAC TIMING AND METHOD FOR OPERATING THE SAME

(75) Inventors: Kyoung-Nam Kim, Kyoungki-do (KR); Ho-Youb Cho, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 888 days.

(21) Appl. No.: 12/003,549

(22) Filed: Dec. 28, 2007

(65) Prior Publication Data
US 2008/0240327 A1  Oct. 2, 2008

(30) Foreign Application Priority Data
Mar. 29, 2007  (KR) .................. 10-2007-0030768

(51) Int. Cl.
*H04L 7/00* (2006.01)
(52) U.S. Cl. ......... 375/372; 375/371; 375/376; 375/354
(58) Field of Classification Search .................. 375/371, 375/354, 372, 376; 365/233, 194, 193, 226; 711/167
See application file for complete search history.

(56) References Cited

U.S. PATENT DOCUMENTS

| | | | | |
|---|---|---|---|---|
| 6,215,710 B1 * | 4/2001 | Han et al. | ....................... | 365/193 |
| 6,229,363 B1 * | 5/2001 | Eto et al. | ....................... | 327/158 |
| 6,426,900 B1 * | 7/2002 | Maruyama et al. | ........... | 365/194 |
| 6,446,180 B2 * | 9/2002 | Li et al. | ......................... | 711/167 |
| 6,862,250 B2 * | 3/2005 | Shin | ......................... | 365/233.17 |
| 6,977,848 B2 | 12/2005 | Choi | | |
| 6,982,924 B2 | 1/2006 | Na | | |
| 6,987,705 B2 | 1/2006 | Kim et al. | | |
| 7,027,336 B2 | 4/2006 | Lee | | |
| 7,081,784 B2 | 7/2006 | Kang | | |
| 7,388,805 B2 * | 6/2008 | Lee et al. | .................... | 365/233.1 |
| 2002/0105838 A1 * | 8/2002 | Maruyama et al. | ........... | 365/194 |
| 2004/0052152 A1 * | 3/2004 | Kono | ............................ | 365/233 |
| 2007/0091710 A1 * | 4/2007 | Oh | ................................ | 365/233 |
| 2007/0121394 A1 * | 5/2007 | Noda et al. | .................... | 365/194 |
| 2007/0291555 A1 * | 12/2007 | Kishimoto et al. | ....... | 365/189.05 |
| 2009/0080272 A1 * | 3/2009 | Lee et al. | ...................... | 365/194 |

FOREIGN PATENT DOCUMENTS

| | | |
|---|---|---|
| JP | 2002-056677 | 2/2002 |
| JP | 2004-327008 | 11/2004 |
| KR | 10-2002-0034437 | 5/2002 |
| KR | 10-2006-0062426 | 6/2006 |

* cited by examiner

*Primary Examiner* — Shuwang Liu
*Assistant Examiner* — Helene Tayong
(74) *Attorney, Agent, or Firm* — IP & T Group LLP

(57) ABSTRACT

A semiconductor memory device is capable of controlling a tAC with a timing margin in an output data process. The semiconductor memory device includes a delay locked loop circuit, a tAC control unit, a reference signal generating unit, and a data output block. The delay locked loop circuit produces delay locked clock signals through a delay locking operation. The tAC control unit adjusts a delay value of the delay locked clock signals in order to control a tAC timing, thereby generating output reference signals. The reference signal generating unit produces a latch reference signal in response to the delay locked clock signals. The data output block latches data in response to the latch reference signal and for outputting the latched data in response to the output reference signals.

5 Claims, 9 Drawing Sheets

SEMICONDUCTOR MEMORY DEVICE CAPABLE OF CONTROLLING TAC TIMING AND METHOD FOR OPERATING THE SAME

CROSS-REFERENCE TO RELATED APPLICATIONS

The present invention claims priority of Korean patent application no. 10-2007-0030768, filed in the Korean Patent Office on Mar. 29, 2007, which is incorporated by reference in its entirety.

BACKGROUND OF THE INVENTION

The present invention relates to a semiconductor memory device; and, more particularly, to a data output circuit in a semiconductor memory device.

In a system equipped with a plurality of semiconductor devices for performing various functions, a semiconductor memory device functions as an apparatus for storing data. The semiconductor memory device outputs data, which correspond to the address signals inputted from a data processing unit, for example, a central processing unit, to a device to request the data, or stores data delivered by the data processing unit in unit cells corresponding to the address signals which are inputted together with the data.

The operating speed of the system is getting faster and faster. Therefore, the semiconductor memory devices are more and more required to have fast input and output speed in the data processing unit. Recently, the operating speed of the data processing unit is getting faster and faster in the engineering development process of the semiconductor integrated circuits; however, the semiconductor memory devices to deliver the data to the data processing unit is not in compliance with the input and output speed of the data processing unit.

In order to enhance the data I/O speed of the semiconductor memory device to a degree which is satisfied by the data processing unit, various semiconductor memory devices have been developed up to now. Synchronous memory devices in which the data are inputted and outputted in response to system clock signals have been proposed until a recent date. The synchronous memory devices output the data to the data processing unit in response to the inputted system clock signals and also receive the data from the data processing unit in response to the inputted system clock signals. However, since the synchronous memory devices are unable to follow the operating speed of the data processing unit, DDR synchronous memory devices have been developed. The DDR synchronous memory devices input and output the data in response to a transition timing of the system clock signal. That is, in the DDR synchronous memory devices, the data are inputted and outputted in synchronization with rising and falling edges of the system clock signal.

However, the system clock signal inputted into the semiconductor memory device reaches to a data output circuit, inevitably having a delay time which is caused by both a clock input buffer disposed within the memory device and a transmission line to transmit the clock signal thereto. Therefore, when the data output circuit outputs the data in synchronization with the system clock signals which already have such a delay time, an external circuit which receives the output data from the semiconductor memory device may take them asynchronously with the rising edge and the falling edge of the system clock signal.

To solve this problem, the semiconductor memory device includes a delay locked loop circuit for locking an amount of the delay time of the clock signal. The delay locked loop circuit is a circuit to compensate for the delay time which is caused by the internal circuits in the memory device until the system clock signal is delivered to the data output circuit after being inputted to the memory device. The delay locked loop circuit finds out an amount of the delay time of the system clock signal which is caused by delay circuits, such as the input buffer and the clock signal transmission line, and delays the system clock signal based on the amount of delay which has been found. The delay locked loop outputs the delayed system clock to the data output circuit. That is, the system clock signal inputted into the memory device is delivered to the data output circuit with a fixed delay time by the delay locked loop. The data output circuit outputs the data in synchronization with the delay-locked clock signal and the external circuit regards the output data as the normal data which are accurately outputted in synchronization with the system clock signal.

In the actual operation, the delay-locked clock signal outputted from the delay locked loop circuit is transferred to an output buffer at a point of time which is determined faster than the data output time by one period of time and the data are outputted in synchronization with the transferred delay-locked clock signal. As a result, the data are more rapidly outputted than the amount of delay time of the system clock signals caused by the internal circuits of the memory device. In this way, it seems to the external circuit of the memory device that the data are accurately outputted in synchronization with the rising edge and the falling edge of the system clock signal. In conclusion, the delay locked loop circuit is a circuit to find out a delay value to compensate for the delay time of the system clock signal within the memory device, thereby achieving the fast data output operation.

The semiconductor memory devices output the data to an external circuit in synchronization with the delay locked clock signals after internally preparing the data to be outputted using the delay locked clock signals from the delay locked loop circuit. Generally, the timing relation between the transition timing of the system clock signal and the output timing of the data is expressed as "tAC." Accordingly, in order to control "tAC," the semiconductor memory devices should control the output timing of the delay locked clock signal. However, this causes a mismatch of a timing required to process the data to be outputted therein. As a result, there is a problem in that the data are not outputted at a predetermined timing.

SUMMARY OF THE INVENTION

An embodiment of the present invention is directed to providing a semiconductor memory device capable of controlling a tAC with facility. Also, it is directed to providing a semiconductor memory device capable of easily controlling a tAC with a timing margin in an output data process.

In accordance with an aspect of the present invention, a semiconductor memory device includes a delay locked loop circuit for producing delay locked clock signals through a delay locking operation, a tAC control unit for adjusting a delay value of the delay locked clock signals in order to control a tAC timing, thereby generating output reference signals, a reference signal generating unit for producing a latch reference signal in response to the delay locked clock signals, and a data output block for latching data in response to the latch reference signal and for outputting the latched data in response to the output reference signals.

In accordance with another aspect of the present invention, a method for driving semiconductor memory device includes generating delay locked clock signals through a delay locking operation, adjusting a delay value of the delay locked clock signals in order to control a tAC timing, thereby generating output reference signals, generating data output enable signals in response to the output reference signals, latching data, which are provided by a memory core area, in response to the delay locked clock signals, and outputting the latched data in response to the data output enable signals.

In accordance with a further aspect of the present invention, a method for driving a semiconductor memory device includes generating delay locked clock signals through a delay locking operation, adjusting a delay value of the delay locked clock signal in order to control a tAC timing, thereby outputting output reference signals, generating data output enable signals in response to the output reference signals, adjusting a delay value of the delay locked clock signals in order to control a latch timing, thereby a latch reference signal, latching data, which are provided by a memory core area, in response to the latch reference signal, and outputting the latched data in response to the data output enable signals.

DESCRIPTION OF SPECIFIC EMBODIMENTS

Hereinafter, a semiconductor memory device in accordance with the present invention will be described in detail referring to the accompanying drawings.

Figure 1:
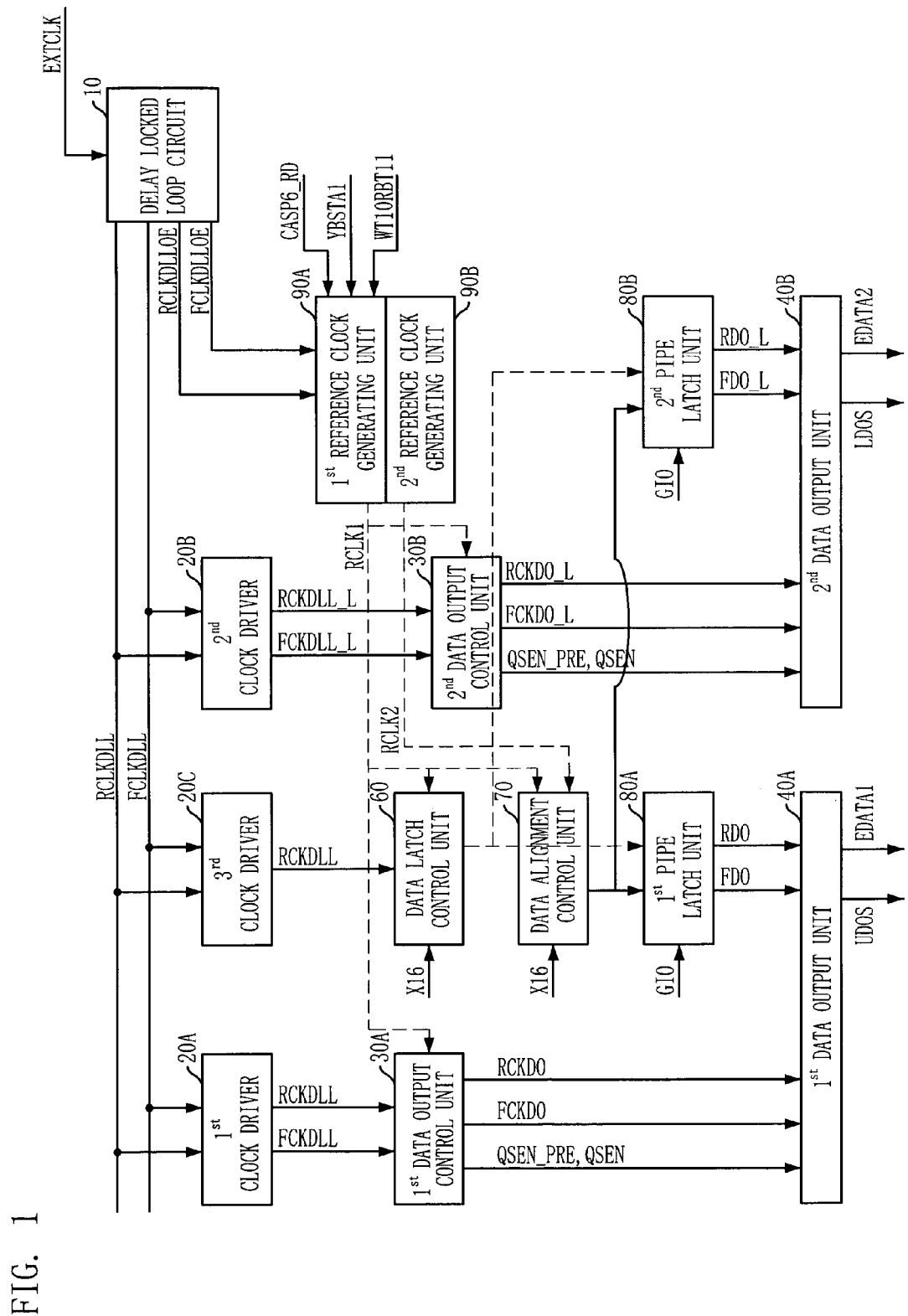
FIG. 1 is a block diagram illustrating a semiconductor memory device.

FIG. 1 is a block diagram of the semiconductor memory device. The semiconductor memory device includes a delay locked loop circuit 10, first to third clock drivers 20A to 20C, first and second data output control units 30A and 30B, first and second data output units 40A and 40B, a data latch control unit 60, a data alignment control unit 70, first and second pipe latch units 80A and 80B, and first and second reference clock generating units 90A and 90B.

The delay locked loop circuit 10, which receives a system clock signal EXTCLK, produces first delay locked clock signals RCLKDLL and FCLKDLL and second delay locked clock signals RCLKDLLOE and FCLKDLLOE. The first delay locked clock signals RCLKDLL and FCLKDLL and the second delay locked clock signals RCLKDLLOE and FCLKDLLOE have the same timing and each of them is outputted by a corresponding circuit area. The first to third clock drivers 20A to 20C to receive the first delay locked clock signals RCLKDLL and FCLKDLL increase the derivability of the delay locked clock signal.

The first data output control unit 30A produces data output enable signals FCKDO and RCKDO and control signals QSEN_PRE and QSEN to inform preamble and postamble sections for producing a data strobe signal, by using clock signals FCKDLL and RCKDLL outputted from the first clock driver 20A and a reference clock signal RCLK1 provided from the first reference clock generating unit 90A. The operation of the second data output control unit 30B is similar to that of the first data output control unit 30A. The first data output circuit 40A produces the data strobe signal DQS by using the control signals QSEN_PRE and QSEN and data output enable signals FCKDO and RCKDO and outputs data FDO and RDO, which are provided from the first pipe latch unit 80A, in response to the data output enable signals FCKDO and RCKDO to an external circuit. The operation of the second data output circuit 40B is similar to that of the first data output circuit 40A.

The first pipe latch unit 80A latches the data provided from the memory core area through a pipeline structure included therein and outputs the latch data to the first data output circuit 40A. The operation of the second pipe latch unit 80B is similar to that of the first pipe latch unit 80A. The data latch control unit 60 controls the first and the second pipe latch units 80A and 80B to latch and output the data. Concretely, the data latch control unit 60 outputs latch control signals ROUTEN and FOUTEN to the first and second pipe latch units 80A and 80B by synchronizing the clock signal RCLKDLL outputted from the third clock driver 20C with a transition timing of the reference clock signal RCLK1 outputted from the first reference clock generating unit 90A.

The data alignment control unit 70 controls the order of the data to be outputted among a plurality of data which are latched in the first and the second pipe latch units 80A and 80B. The first reference clock generating unit 90A receives the second delay locked clock signals RCLKDLLOE and FCLKDLLOE and then produces the reference clock signal RCLK1 which is used in the first and second data output control units 30A and 30B, the data latch control unit 60 and the data alignment control unit 70. The second reference clock generating unit 90B receives the second delay locked clock signals RCLKDLLOE and FCLKDLLOE and then produces a reference clock signal RCLK2 which is used in the data alignment control unit 70.

Therefore, the first delay locked clock signals RCLKDLL and FCLKDLL outputted from the delay locked loop circuit becomes the reference clock signal to output the data to an external circuit and the second delay locked clock signals RCLKDLLOE and FCLKDLLOE are used for the operation to prepare the data output to the external circuit. Concretely, the first delay locked clock signals RCLKDLL and FCLKDLL are used in the first clock driver 20A, the second clock driver 20B, the first data output control unit 30A, and the second data output control unit 30B. The second delay locked clock signals RCLKDLLOE and FCLKDLLOE are used in the first reference clock generating unit 90A and the second reference clock generating unit 90B. The first data output control unit 30A, the data latch control unit 60, the data alignment control unit 70, the first pipe latch unit 80A and the second pipe latch unit 80B are circuit blocks which are influenced on the reference clock signal RCLK1 outputted from the first reference clock generating unit 90A.

Figure 2:
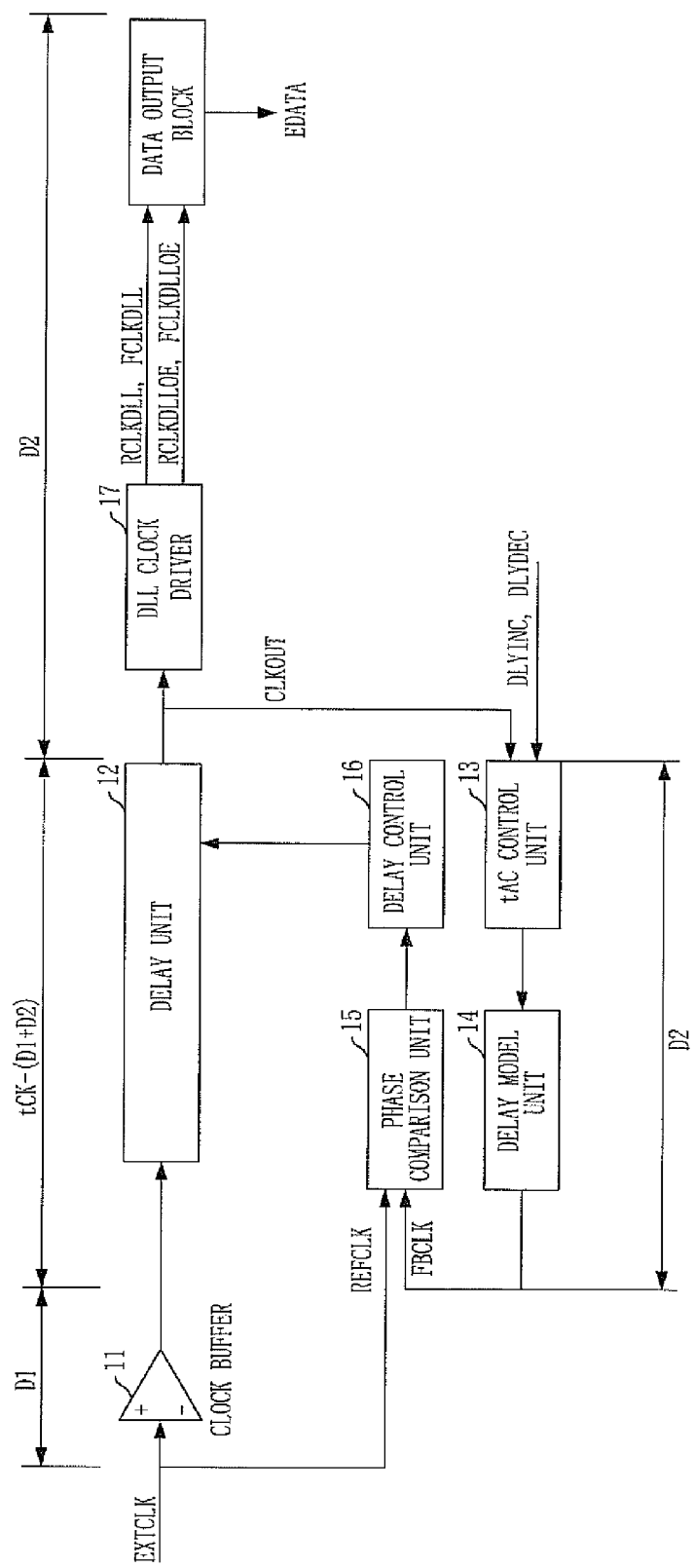
FIG. 2 is a block diagram illustrating a delay locked loop circuit described in FIG. 1.

FIG. 2 is a block diagram illustrating the delay locked loop circuit described in FIG. 1. The delay locked loop circuit 10 includes a clock buffer 11, a delay unit 12, a tAC control unit 13, a delay model unit 14, a phase comparison unit 15, a delay control unit 16, and a DLL clock driver 17. A data output block shown in FIG. 2 represents all the circuits illustrated in FIG. 1 except for the delay locked loop circuit 10. Since the delay locked loop circuit illustrated in FIG. 2 is a general delay locked loop which is widely known to the person skilled in the art, the detailed description of the operation will be omitted. In order to perform the delay locking operation in the delay locked loop circuit of FIG. 2, the first delay locked clock signals RCLKDLL and FCLKDLL and the second delay locked clock signals RCLKDLLOE and FCLKDLLOE are produced and the data output block outputs the data to an external circuit using these delay locked clock signals. Here, the delay locking operation will be focused on the process to produce the first delay locked clock signals RCLKDLL and FCLKDLL and the second delay locked clock signals RCLKDLLOE and FCLKDLLOE. If the data are outputted in synchronization with the delay locked clock signals, it seems to the external circuit of the memory device that the data are accurately outputted in synchronization with the system clock signal.

The tAC control unit 13 controls a delay value of the delay model unit 14 by using inputted control signals DLYINC and DLYDEC. As mentioned above, a tAC indicates a time from a transition timing of the clock signal to an output timing of the data. If the data outputted from the data output stage does not harmonize with the scheduled tAC value, the delay value set up in the delay model unit 14 is controlled through the tAC control unit 13 and the output timing of the first delay locked clock signals RCLKDLL and FCLKDLL and the second delay locked clock signals RCLKDLLOE and FCLKDLLOE is controlled by the delay value. Therefore, the output timing of data outputted through data output stage is controlled so that the deviated tAC is adjusted.

Figure 3:
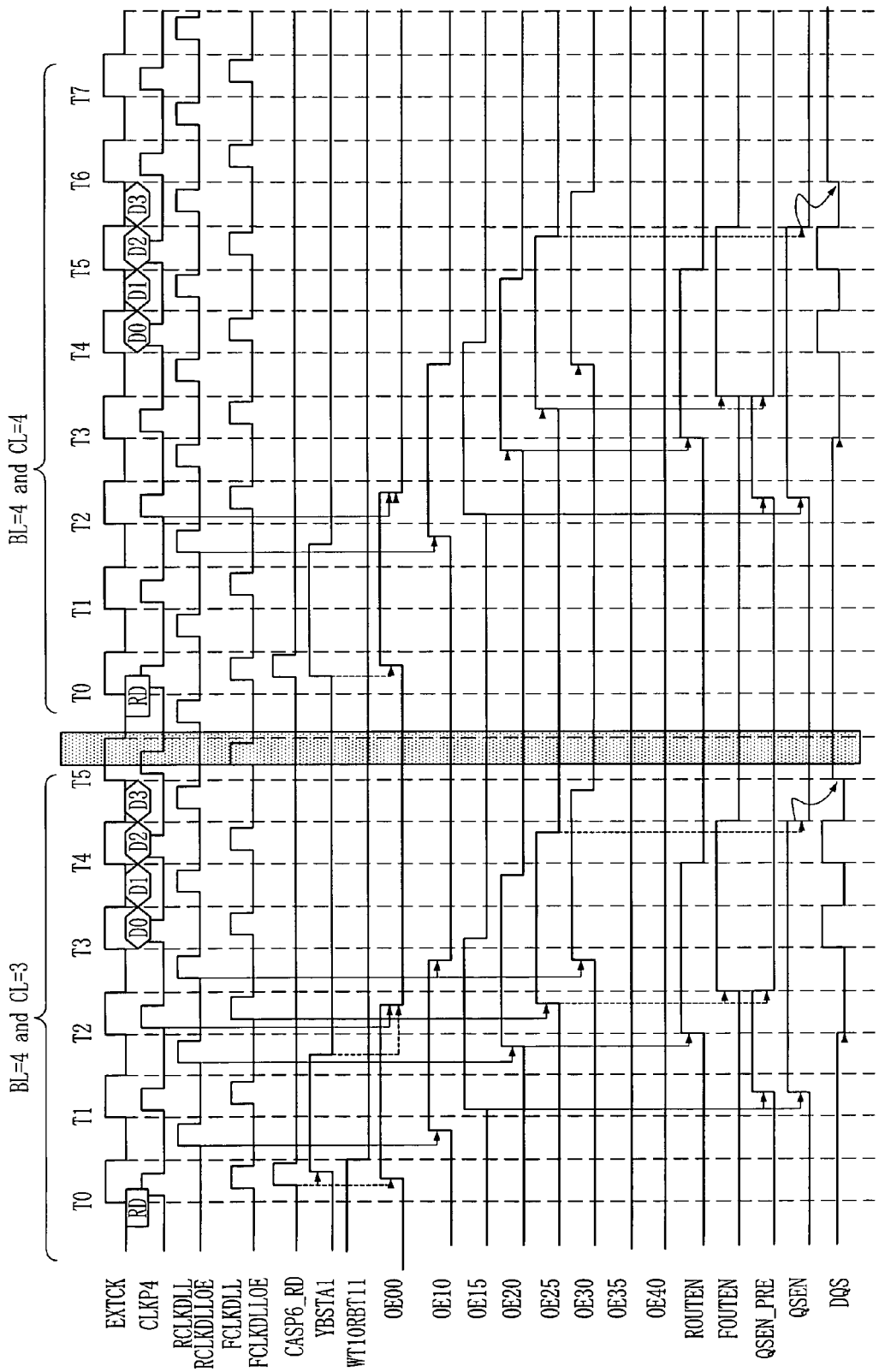
FIG. 3 is a signal timing diagram illustrating an operation of the semiconductor memory device described in FIG. 1.

FIG. 3 is a signal timing diagram showing an operation of the semiconductor memory device described in FIG. 1. In FIG. 3, the operation of the semiconductor memory device of FIG. 1 is shown based on that a CAS latency is three and four when the burst length is four. The burst length, in the semiconductor memory device, is the number of data which are continuously outputted through one data access and the CAS latency is the number of clock signals which are required to output the data after a command is inputted.

An internal clock signal CLKP4 is generated in the semiconductor memory device by using the system clock signal EXTCLK inputted from an external circuit. In fact, the first delay locked clock signals RCLKDLL and FCLKDLL and the second delay locked clock signals RCLKDLLOE and FCLKDLLOE are generated by using this internal clock signal CLKP4. Meanwhile, a read command is inputted and a read command signal CASP6_RD which corresponds to the read command is produced. A write sensing signal WT10RBT11 which is a signal to discriminate the read operation from the write operation is maintained at a logic low level during the read operation. The read operation signal YBSTA1 is a signal to define a section for performance by the read command.

A plurality of section signals OE00 to OE40 are generated in the data latch control unit 60. First, the first section signal OE00 is produced in synchronization with the read command signal CASP6_RD and the read operation signal YBSTA1. The rest section signals OE10 to OE40 are successively produced based on the first section signal OE00 in response to the transition of the second delay locked clock signals RCLKDLLOE and FCLKDLLOE. The latch control signals ROUTEN and FOUTEN which are outputted from the data latch control unit 60 in order to control the first and the second pipe lines 80A and 80B to output the data.

The first reference clock generating unit 90A selects a section signal, which corresponds to the CAS latency, among the plurality of section signals OE00 to OE40 and outputs the selected section signal to the data latch control unit 60 as a reference signal RCLK1. The data latch control unit 60 produces the latch control signals ROUTEN and FOUTEN by using the reference signal RCLK1. In the case where the CAS latency is three and the burst length is four, the read command RD is inputted and four data D0 to D3 are successively outputted in synchronization with the third system clock EXTCLK. In a similar way, in the case where the CAS latency is four and the burst length is four, the read command RD is inputted and four data D0 to D3 are successively outputted in synchronization with the fourth system clock EXTCLK.

Figure 4:
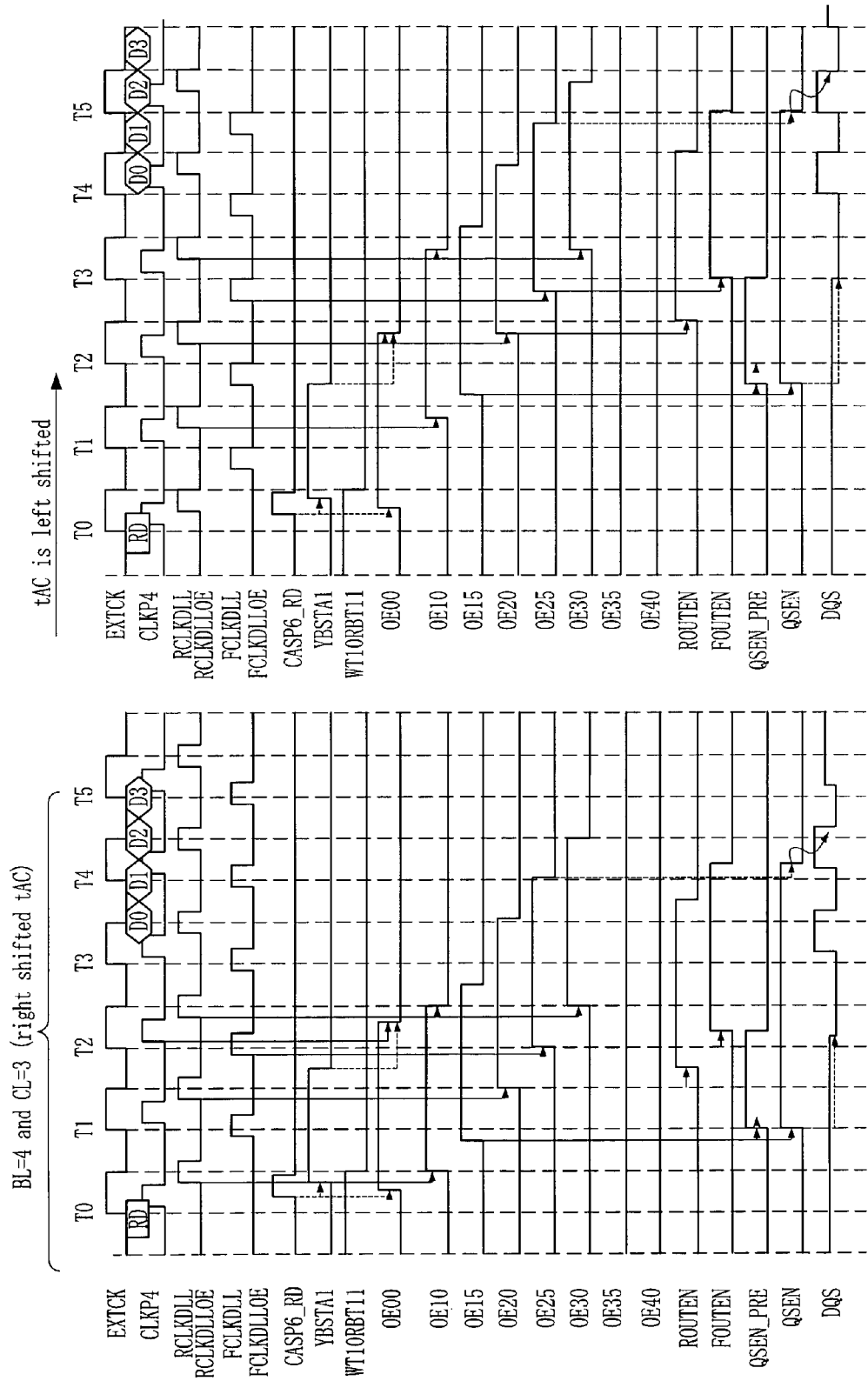
FIG. 4 is a signal timing diagram illustrating a tAC control operation of the semiconductor memory device described in FIG. 1.

FIG. 4 is a signal timing diagram illustrating a tAC control operation of the semiconductor memory device described in FIG. 1. As described above, when a tAC value is different from a specification, the output timings of the first delay locked clock signals RCLKDLL and FCLKDLL and the second delay locked clock signals RCLKDLLOE and FCLKDLLOE are controlled by the tAC control unit which is provided in the delay locked loop circuit. In the semiconductor memory device in FIG. 1, the output timings of the first delay locked clock signals RCLKDLL and FCLKDLL and the second delay locked clock signals RCLKDLLOE and FCLKDLLOE are changed when the tAC value is controlled. Since the second delay locked clock signals RCLKDLLOE and FCLKDLLOE are used for preparing the output data, the semiconductor memory device cannot internally prepare the output data in the scheduled timing when the delay value of the second delay locked clock signals RCLKDLLOE and FCLKDLLOE is changed.

Referring to a signal timing diagram in left side of FIG. 4, it represents the case of a right shifted tAC value. Accordingly, the transition timing of the first delay locked clock signals RCLKDLL and FCLKDLL can be left shifted in order to reduce the tAC value as shown in the right side of FIG. 4. However, in this case, the transition timing of the second delay locked clock signals RCLKDLLOE and FCLKDLLOE are also left shifted. The generation timing of the section signal OE10 lags behind the scheduled timing by one clock signal. As a result, the output timing of the data lags behind the scheduled data output timing by one clock signal so that the data may be outputted later than the CAS latency by one clock signal. That is, in the case where the CAS latency is three, the data are outputted at the time of the transition of the fourth clock signal after the read command input, but not outputted at the time of the transition of the third clock signal.

The first section signal OE00 is generated in response to the read signal CASP6_RD and thereafter the subsequent section signals including the section signal OE10 are produced in synchronization with the transition timing of the second delay locked clock signals RCLKDLLOE and FCLKDLLOE. Accordingly, if a change is generated in the transition timing of the second delay locked clock signals RCLKDLLOE and FCLKDLLOE, for example, if the scheduled transition timing of the second delay locked clock signal RCLKDLLOE becomes fast, the second section signal OE10 may not be generated exactly at the scheduled transition timing of the second delay locked clock signal RCLKDLLOE. As a result, since the delay values of the first delay locked clock signals RCLKDLL and FCLKDLL and the second delay locked clock signals RCLKDLLOE and FCLKDLLOE are adjusted together in the semiconductor memory device of FIG. 1, the above-mentioned fault can be caused at any time.

In the semiconductor memory device according to the present invention, the delay value of the first delay locked clock signals RCLKDLL and FCLKDLL is adjusted in the control process of the tAC value; however, the delay value of the second delay locked clock signals RCLKDLLOE and FCLKDLLOE is not changed.

Figure 5:
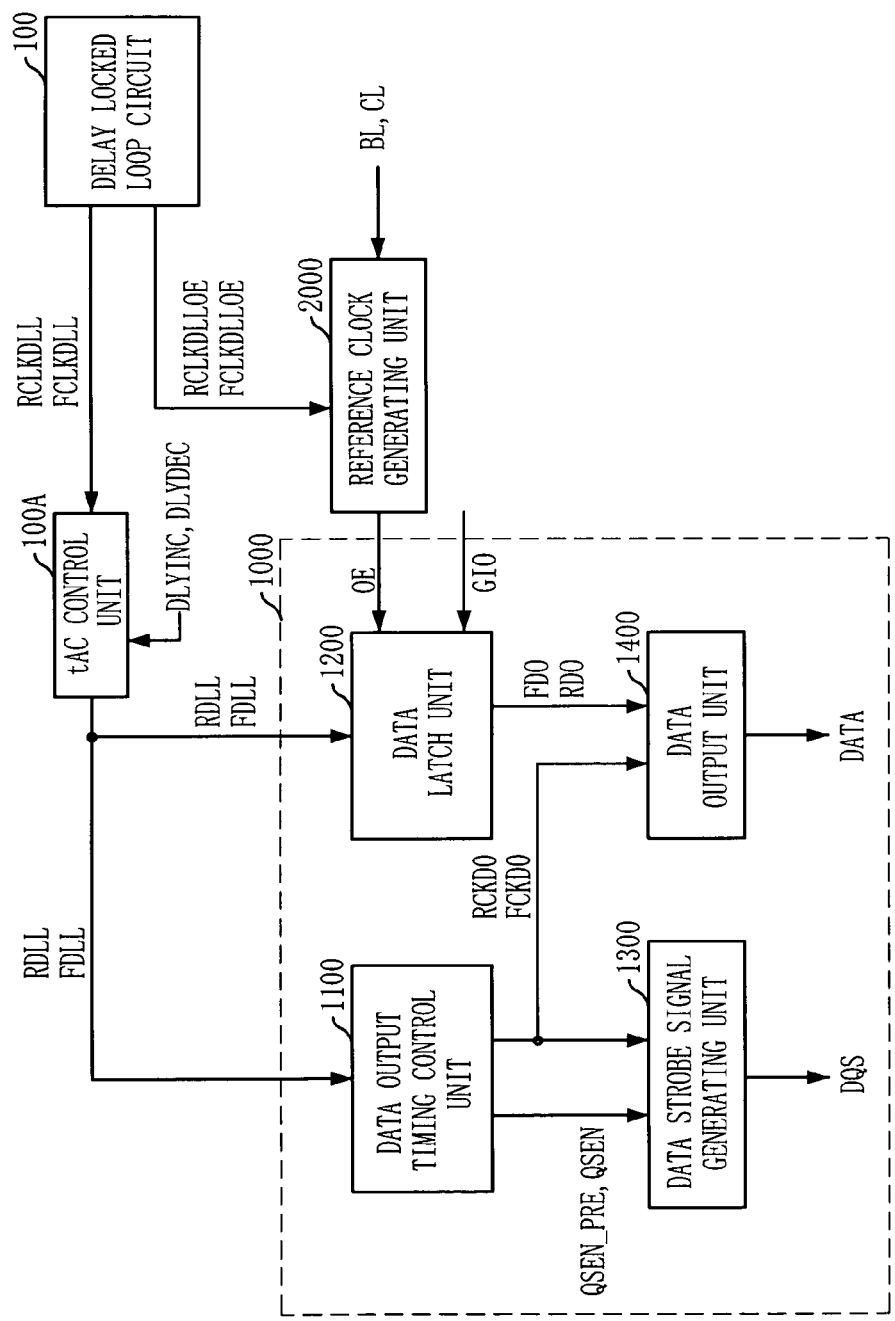
FIG. 5 is a block diagram illustrating a semiconductor memory device according to a first embodiment of the present invention.

FIG. 5 is a block diagram illustrating the semiconductor memory device according to a first embodiment of the present invention. The semiconductor memory device includes a delay locked loop circuit 100, a tAC control unit 100A, a data output block 1000 and a reference clock generating unit 2000. The data output block 1000 includes a data output timing control unit 1100, a data latch unit 1200, a data strobe signal generating unit 1300 and a data output unit 1400.

The delay locked loop circuit 100 produces a first delay locked clock signals RCLKDLL and FCLKDLL and a second delay locked clock signals RCLKDLLOE and FCLKDLLOE. The tAC control unit 100A outputs a delay-adjusted clock signals RDLL and FDLL by controlling the delay value of the first delay locked clock signals RCLKDLL and FCLKDLL in response to a control signals DLYINC and DLYDEC. The tAC control unit 100A is provided to adjust the tAC timing. The tAC control unit 100A controls the output timing of the data outputted from the data output block 1000 by controlling the delay-adjusted clock signals RDLL and FDLL.

The reference clock generating unit 2000 generates a reference clock OE using the second delay locked clock signals RCLKDLLOE and FCLKDLLOE. The data latch unit 1200 latches data GIO, which are provided from the memory core area, by synchronizing the reference clock OE with the delay-adjusted clock signals RDLL and FDLL provided from the tAC control unit 100A and outputs the latched data FDO and RDO to the data output unit 1400. The data output unit 1400 outputs the data FDO and RDO provided from the data latch unit 1200 in response to data output enable signals FCKDO and RCKDO. The data strobe signal generating unit 1300 receives the data output enable signals FCKDO and RCKDO and the control signals QSEN_PRE and QSEN, indicative of the preamble and postamble sections, from the data output timing control unit 1100 and then produces a data strobe signal DQS.

Therefore, in the delay locked loop circuit of the semiconductor memory device according to this embodiment, after producing the first delay locked clock signals RCLKDLL and FCLKDLL and the second delay locked clock signals RCLKDLLOE and FCLKDLLOE, the delay value of the first delay locked clock signals RCLKDLL and FCLKDLL is controlled by the tAC control unit and the data output enable signals FCKDO and RCKDO are produced by using these controlled signals. Meanwhile, the second delay locked clock signals RCLKDLLOE and FCLKDLLOE are used for latching the output data in the data latch unit 1200 and also used as the reference signals for transferring the output data to the data output unit 1400.

Accordingly, being different from the semiconductor memory device of FIG. 1, even though the delay valve of the first delay locked clock signals RCLKDLL and FCLKDLL is controlled in order to adjust the tAC value, the reference clock signal OE from the reference clock generating unit 2000, is outputted exactly at the scheduled timing because the second delay locked clock signals RCLKDLLOE and FCLKDLLOE, which are used for latching the output data in the data latch unit 1200, are not changed. As a result, the tAC value can be changed while the operating margin required to process the data is not changed internally.

Figure 6:
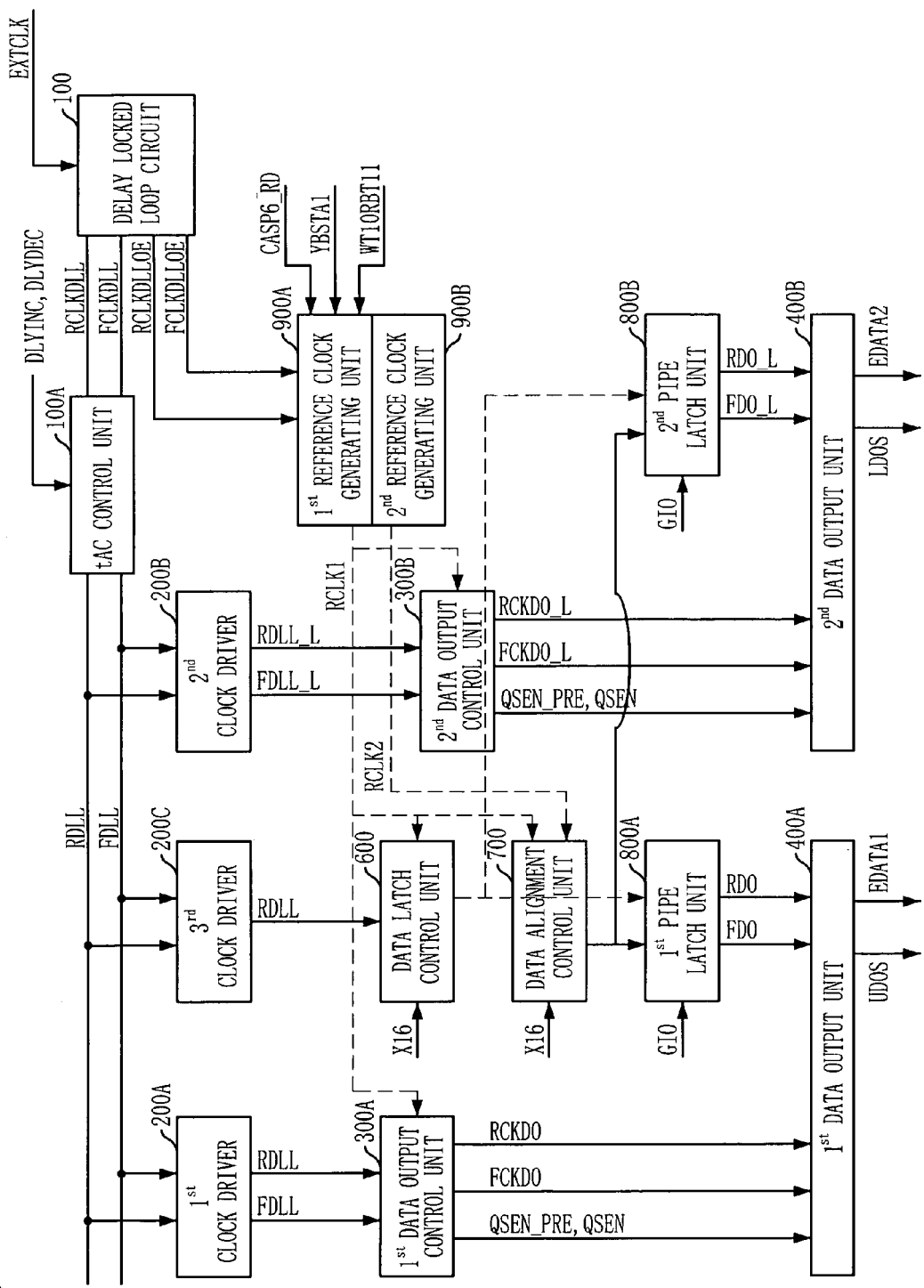
FIG. 6 is a block diagram illustrating a semiconductor memory device according to a second embodiment of the present invention.

FIG. 6 is a block diagram illustrating a semiconductor memory device according to a second embodiment of the present invention. The semiconductor memory device includes a delay locked loop circuit 100, a tAC control unit 100A, first to third clock drivers 200A to 200C, first and second data output control units 300A and 300B, first and second data output units 400A and 400B, a data latch control unit 600, a data alignment control unit 700, first and second pipe latch units 800A and 800B, and a first and second reference clock generating units 900A and 900B. Since the circuit blocks illustrated in FIG. 6 performs the same operation as those illustrated in FIG. 1, the detailed description related to these blocks will be omitted. The tAC control unit 100A controls the delay value of the first delay locked clock signals RCLKDLL and FCLKDLL and then outputs delay-adjusted clock signals RDLL and FDLL.

Moreover, the first and second clock drivers 200A and 200B and the first and second data output control unit 300A and 300B illustrated in FIG. 6 serve as a functional block like the data output timing control unit 1100 of FIG. 5. Also, the third clock driver 200C, the data latch control unit 600, the data alignment control unit 700, and the first and second pipe latch units 800A and 800B illustrated in FIG. 6 serve a functional block like the data latch unit 1200 of FIG. 5. Further, the data output units 400A and 400B of FIG. 6 are circuit blocks each of which includes the data strobe signal generating unit 1300 and the data output unit 1400. The first reference clock generating unit 900A and the second reference clock generating unit 900B serve as a functional block like the reference clock generating unit 2000 of FIG. 5.

Figure 7:
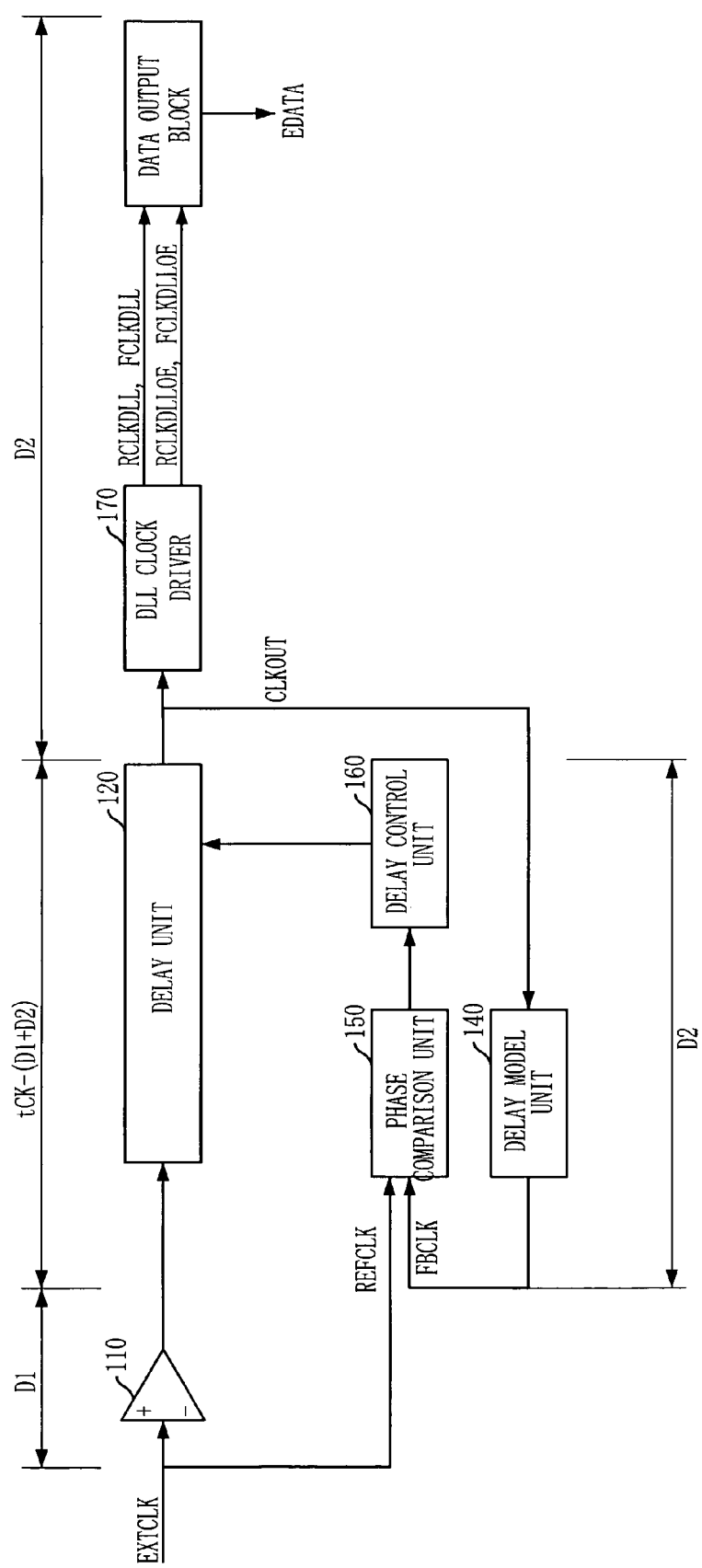
FIG. 7 is a block diagram illustrating a delay locked loop circuit described in FIG. 6.

FIG. 7 is a block diagram illustrating the delay locked loop circuit described in FIG. 6. The delay locked loop circuit 100 includes a clock buffer 110, a delay unit 120, a delay model unit 140, a phase comparison unit 150, a delay control unit 160 and a DLL clock driver 170. The data output block represents all the circuits which are shown in FIG. 6. The delay locked loop circuit 100 produces the first delay locked clock signals RCLKDLL and FCLKDLL and the second delay locked clock signals RCLKDLLOE and FCLKDLLOE and the data output block outputs the data using these delay locked clock signals.

Figure 8:
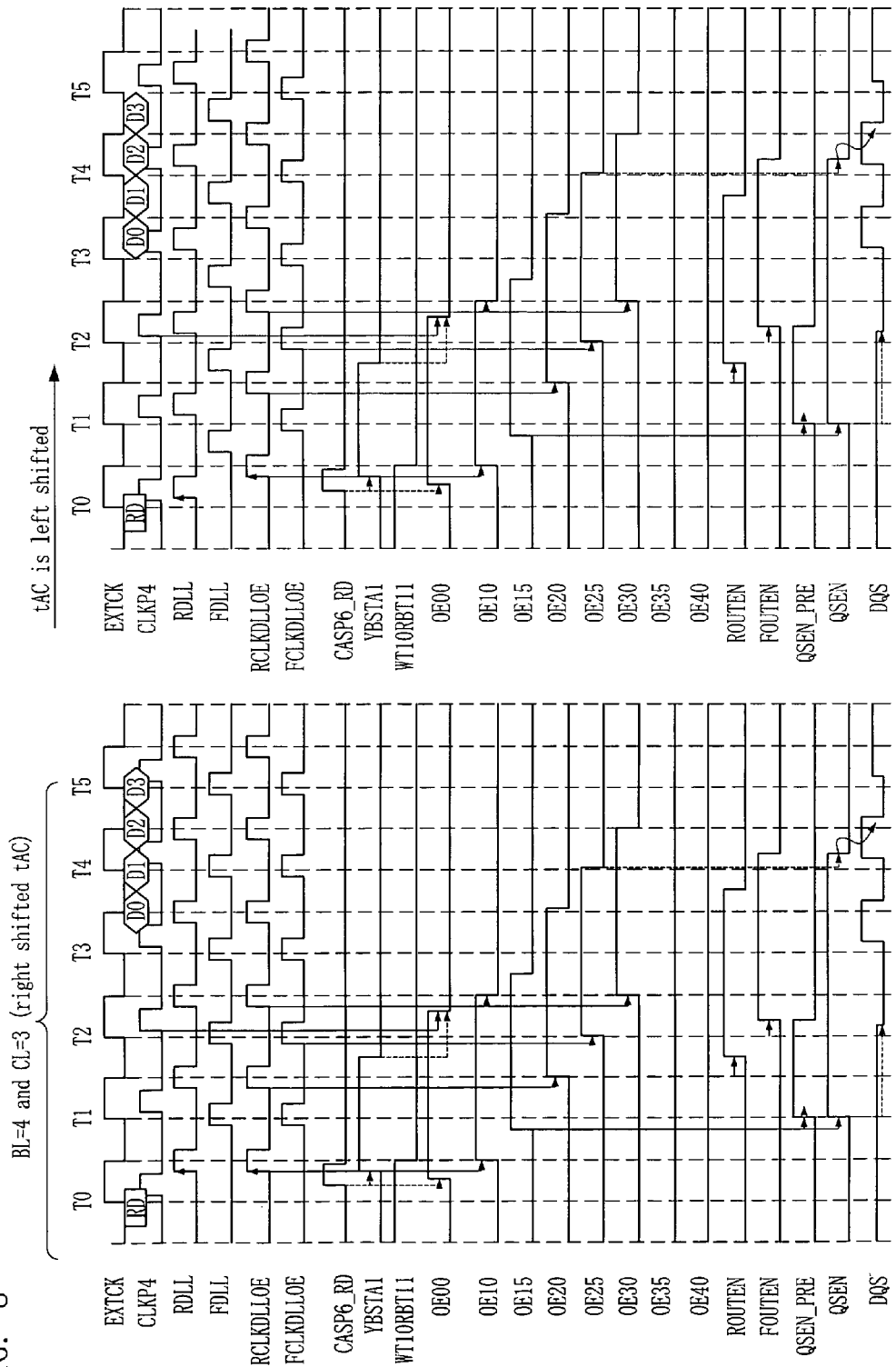
FIG. 8 is a signal timing diagram illustrating a tAC control operation of the semiconductor memory device described in FIG. 6.

FIG. 8 is a signal timing diagram illustrating a tAC control operation of the semiconductor memory device described in FIG. 6. In the case where the burst length is four and the CAS latency is three, the left side of FIG. 8 shows the case that the output timing of the data is right shifted as compared to the transition timing of the system clock signal. In this case, the output timing of the data is left shifted. In the semiconductor memory device according to the preferred embodiment of the present invention, an internal operating margin for processing the data does not decrease because the delay value of the second delay locked clock signals RCLKDLLOE and FCLKDLLOE is not changed even though the delay value of the first delay locked clock signals RCLKDLL and FCLKDLL is adjusted in order to adjust the tAC value. After the adjustment of the tAC value, the section signals OE00 to OE40 are still produced at the same timing as the previous tAC value so that the data latch unit 2000 can transfer the data to the data output unit 420 at the scheduled timing. Therefore, the data can be outputted to an outside at the scheduled the timing in a state where the tAC value is adjusted.

Figure 9:
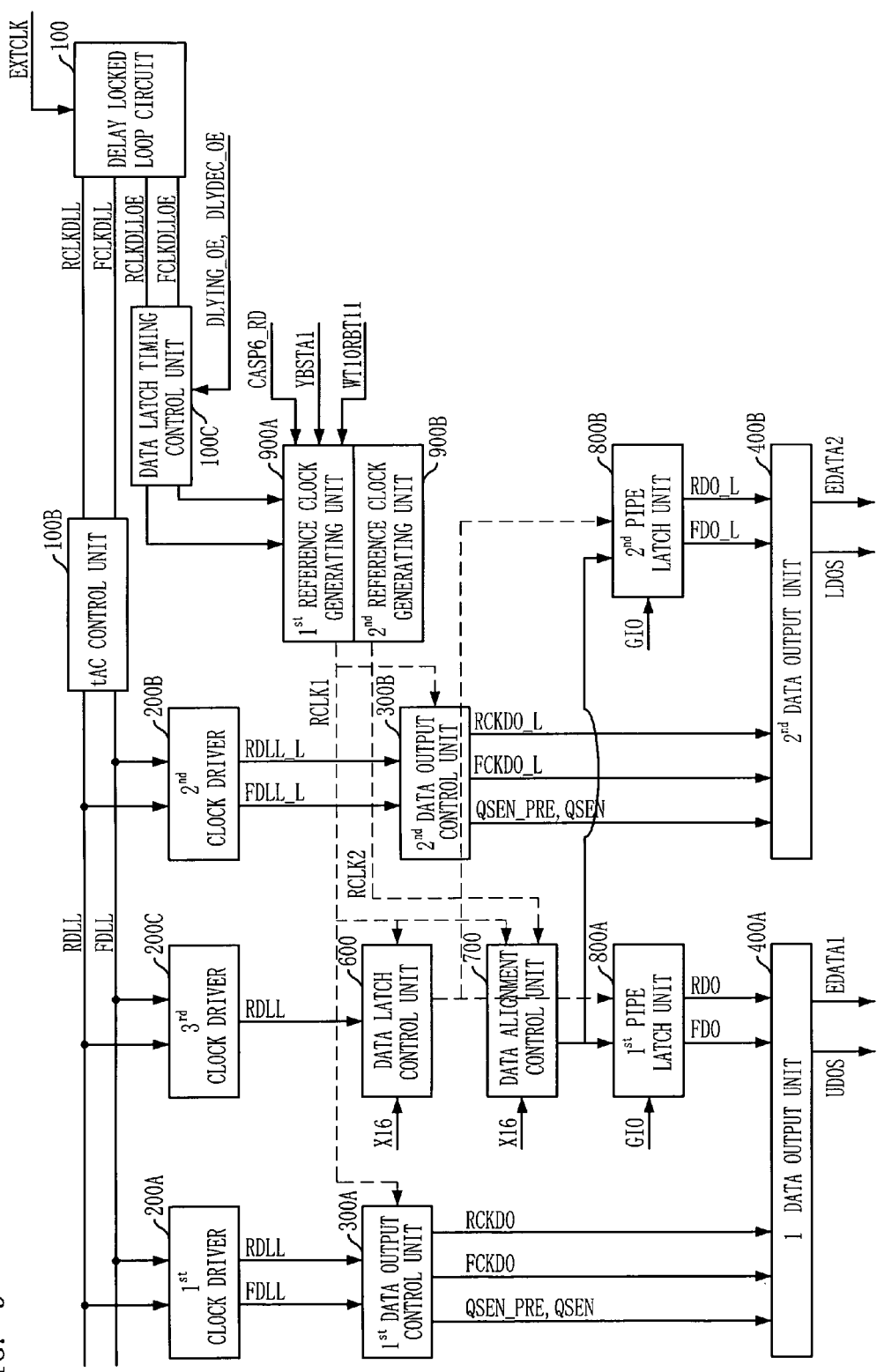
FIG. 9 is a block diagram illustrating a semiconductor memory device according to a third embodiment of the present invention.

FIG. 9 is a block diagram illustrating a semiconductor memory device according to a third embodiment of the present invention. The semiconductor memory device illustrated in FIG. 9 is characterized in that a data latch timing control unit 100C is additionally included in the semiconductor memory device of FIG. 6. The data latch timing control unit 100C controls the delay value of the second delay locked clock signals RCLKDLLOE and FCLKDLLOE outputted from the delay locked loop circuit. In this way, the processing timing and the output timing of data can be optimally maintained by differently controlling the delay values of the first delay locked clock signals RCLKDLL and FCLKDLL and the second delay locked clock signals RCLKDLLOE and FCLKDLLOE.

As apparent form the above, in the present invention, the operation margin for processing the output data is sufficiently obtained and the tAC timing is effectively adjusted. Therefore, the semiconductor memory device according to the present invention can output the data at the scheduled timing with the reliability.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
a delay locked loop circuit configured to produce first and second delay locked clock signals through a delay locking operation, wherein the first delay locked clock signal is used to output data to an external circuit, and the second delay locked clock signal is used to prepare the data to be outputted to the external circuit;
a tAC control unit, separate from the delay locked loop circuit, configured to receive the first delay locked clock signal from the delay locked loop circuit, adjust a delay value of the first delay locked clock signal in order to control a tAC timing, and output a delay-adjusted clock signal;
a reference signal generating unit configured to generate a reference signal in response to the second delay locked clock signal; and
a data output block configured to produce a data strobe signal in response to the delay-adjusted clock signal, and latch and output the data in response to the delay-adjusted clock signal and the reference signal,
wherein the data output block includes:
a data output timing control unit configured to generate a data output enable signal and a control signal indicative of preamble and postamble in response to the delay-adjusted clock signal;
a data latch unit configured to latch the data, which are provided by a memory core area, in response to the delay-adjusted clock signal and the reference signal;
a data output unit configured to output the data latched in the data latch unit in response to the data output enable signal: and
a data strobe signal generating unit configured to generate the data strobe signal in response to the data output enable signal.

2. The semiconductor memory device of claim 1, wherein the tAC control unit is a controller to adjust the delay value using a fuse option.

3. The semiconductor memory device of claim 1, wherein the data latch unit includes:
a pipe latch unit for latching the data outputted from the memory core area;
a data latch control unit for controlling the pipe latch unit; and
a data alignment control unit for controlling an output order of the data which are latched in the pipe latch unit.

4. A method for driving a semiconductor memory device, including a delay locked loop circuit and a tAC control unit separate from the delay locked loop circuit, comprising:
in the delay locked loop circuit, generating first and second delay locked clock signals through a delay locking operation, wherein the first delay locked clock signal is used to output data to an external circuit, and the second delay locked clock signal is used to prepare the data to be outputted to the external circuit;
in the tAC control unit, receiving the first delay locked clock signal, and adjusting a delay value of the first delay locked clock signal in order to control a tAC timing, thereby generating a delay-adjusted clock signal;
generating a reference signal in response to the second delay locked clock signal; and
latching and outputting data, which are provided by a memory core area, in response to the delay-adjusted clock signal and the reference signal,
wherein the latching and outputting of the data comprises:
generating a data output enable signal and a control signal indicative of preamble and postamble in response to the delay-adjusted clock signal;
latching the data in response to the delay-adjusted clock signal and the reference signal;
generating a data strobe signal in response to the data output enable signal; and
outputting the latched data in response to the data output enable signal.

5. The method of claim 4, wherein the adjusting of the delay value of the first delay locked clock signal comprises adjusting the delay value using a fuse option.

* * * * *